(12) United States Patent  
Argyres (10) Patent No.: US 8,619,451 B1
(45) Date of Patent: Dec. 31, 2013

(54) POWER SAVINGS IN A CONTENT ADDRESSABLE MEMORY DEVICE USING MASKED PRE-COMPARE OPERATIONS

(75) Inventor: Dimitri Argyres, San Jose, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 156 days.

(21) Appl. No.: 13/345,128

(22) Filed: Jan. 6, 2012

(51) Int. Cl.
G11C 15/00 (2006.01)

(52) U.S. Cl.
USPC ........................ 365/49.17; 365/49.1

(58) Field of Classification Search
USPC ............................ 365/49.1, 49.17
See application file for complete search history.

(56) References Cited

U.S. PATENT DOCUMENTS

| | | | |
|---|---|---|---|
| 6,191,969 B1 | 2/2001 | Pereira | |
| 6,191,970 B1 | 2/2001 | Pereira | |
| 6,243,280 B1 | 6/2001 | Wong et al. | |
| 6,430,074 B1 | 8/2002 | Srinivasan | |
| 6,865,098 B1 | 3/2005 | Ichiriu et al. | |
| 6,903,953 B2 | 6/2005 | Khanna | |
| 6,906,937 B1 | 6/2005 | Nataraj | |
| 6,910,097 B1 | 6/2005 | Srinivasan et al. | |
| 6,934,796 B1 | 8/2005 | Pereira et al. | |
| 6,958,925 B1 | 10/2005 | Om et al. | |
| 7,050,318 B1 | 5/2006 | Argyres | |
| 2009/0282189 A1* | 11/2009 | Best et al. | 711/106 |

* cited by examiner

Primary Examiner — Hoai V Ho
(74) Attorney, Agent, or Firm — Sterne, Kessler, Goldstein & Fox PLLC (57) ABSTRACT

A CAM device for comparing a search key with a plurality of ternary words stored in a CAM array includes one or more population counters, a pre-compare memory, and a pre-compare circuit. The present embodiments reduce the power consumption of CAM devices during compare operations between a search key and ternary words stored in a CAM array by selectively enabling the match lines in the CAM array in response to pre-compare operations between a set of population counts corresponding to the masked search key and a set of population counts corresponding to the ternary words stored in the CAM array.

32 Claims, 8 Drawing Sheets

POWER SAVINGS IN A CONTENT ADDRESSABLE MEMORY DEVICE USING MASKED PRE-COMPARE OPERATIONS

TECHNICAL FIELD

This disclosure relates generally to semiconductor memories and specifically to reducing power consumption in content addressable memories.

DESCRIPTION OF RELATED ART

Content addressable memory (CAM) devices are frequently used in network switching and routing applications to determine forwarding destinations for data packets. A CAM device can be instructed to compare a selected portion of an incoming packet (e.g., a destination address extracted from the packet header) with CAM words (e.g., forwarding addresses) stored in an array within the CAM device. If there is a matching entry stored in the CAM array, the index of the matching CAM word can be used to access a corresponding location in an associated memory device to retrieve a destination address and/or other routing information for the packet.

A CAM device includes a CAM array having a number of rows of CAM cells, each for storing a CAM word. During a compare operation, a search key (e.g., a comparand word) is provided to the CAM array and compared with the CAM words stored therein. For each CAM word that matches the search key, a corresponding match line is asserted to indicate the match result. If any of the match lines are asserted, a match flag is asserted to indicate the match condition, and a priority encoder determines the match address or index of the highest priority matching entry in the CAM array.

Typically, the match lines of the CAM array are pre-charged toward a supply voltage (e.g., to logic high) prior to the compare operation. During the compare operation, if the CAM word stored in a row matches the search key, the row's match line remains in its charged state to indicate a match condition for the row. Conversely, if the CAM word stored in a row does not match the search key, the row's match line is discharged toward ground potential (e.g., to logic low) by the one or more mismatching CAM cells to indicate a mismatch condition for the row. The discharged match lines are then pre-charged to the supply voltage for the next compare operation.

Alternately charging and discharging the match lines in a CAM array for compare operations may result in significant power consumption. This power consumption increases as the size and/or density of the CAM array increases and, therefore, undesirably limits the memory size and the scalability of the CAM array. Thus, it would be desirable to reduce the power consumption associated with pre-charging the match lines of a CAM array for compare operations.

BRIEF DESCRIPTION OF THE DRAWINGS

Present embodiments are illustrated by way of example, and not by way of limitation, in the figures of the accompanying drawings and in which like reference numerals refer to similar elements and in which.

DETAILED DESCRIPTION

Methods and apparatuses for reducing power consumption in a CAM device are disclosed. It is to be understood that present embodiments are equally applicable to other memory structures such as, for example, RAM, EPROM, EEPROM, and flash memory devices, as well as other memory architectures including, for example, translation look-aside buffers (TLBs) and look-up tables (LUTs). In the following description, for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present embodiments unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather include within their scope all embodiments defined by the appended claims.

Figure 1:
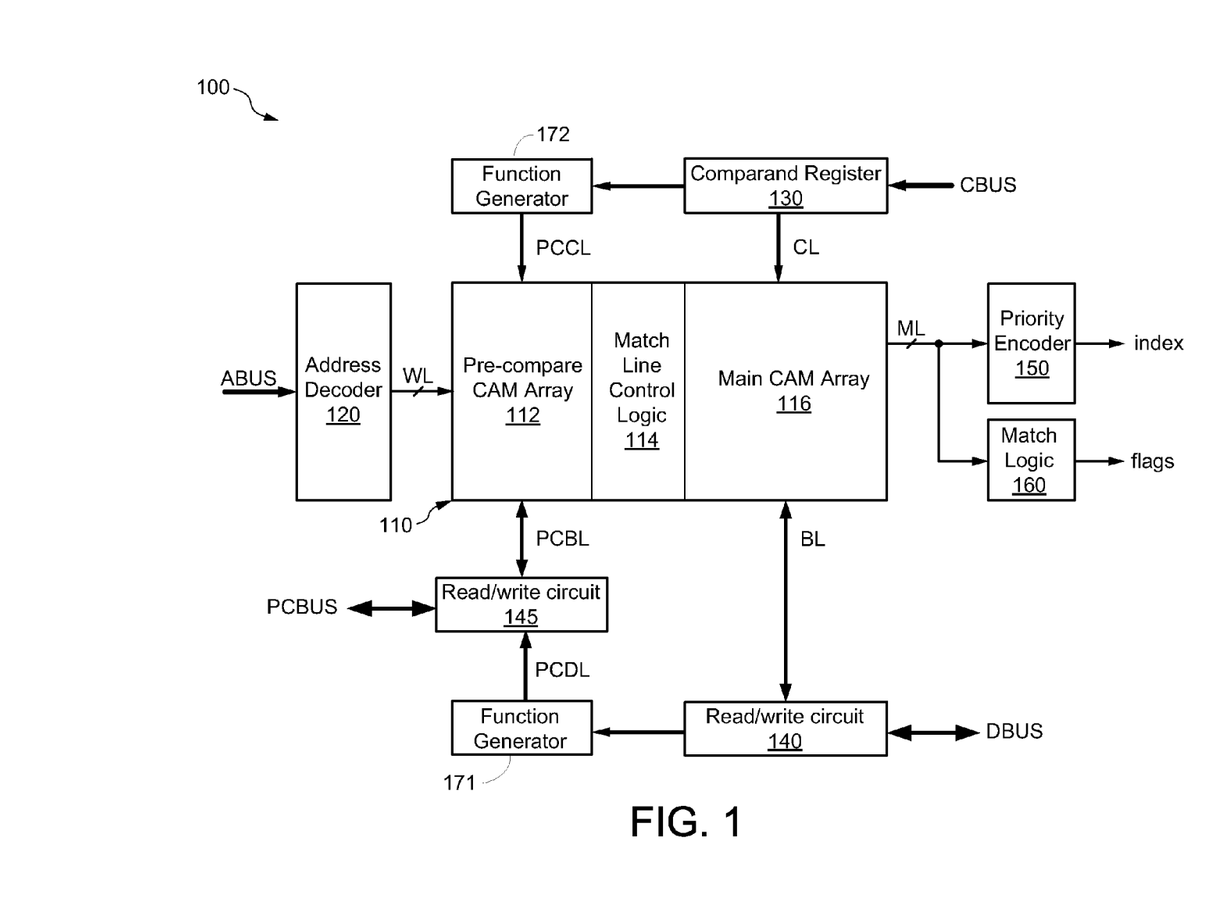
FIG. 1 is a block diagram of a CAM device with a pre-compare CAM array.

FIG. 1 is a block diagram of a CAM device 100 that incorporates a pre-compare CAM array. In FIG. 1, CAM device 100 is shown to include a CAM array 110, which includes a pre-compare CAM array 112, match line control logic 114, and a main CAM array 116. CAM array 110 is also coupled to a first function generator 171 and to a second function generator 172. First function generator 171 includes an input to receive from a data bus DBUS or a read/write circuit 140 a CAM word that is to be written into main CAM array 116, and one or more outputs coupled to corresponding columns of pre-compare CAM array 112 via read/write circuit 145. First function generator 171 performs a predetermined logical function on the CAM word to generate a corresponding set of pre-compare bits, which are then stored into a corresponding row of pre-compare CAM array 112. Second function generator 172 uses the same logical function as the one used by first function generator 171 to generate the encoded search key. Pre-compare CAM array 112 then performs pre-compare operations between the encoded search key and the sets of pre-compare bits stored in pre-compare CAM array 112 to generate pre-compare match results on corresponding pre-compare match lines in pre-compare CAM array 112. Match line control logic 114 is configured to selectively pre-charge the main match lines in main CAM array 116 in response to pre-compare match results in pre-compare CAM array 112. In this manner, for each row in main CAM array 116 that is not pre-charged for a compare operation with the search key, power consumption associated with match line pre-charging is saved, therefore reducing the overall power consumption of CAM device 100.

Figure 2:
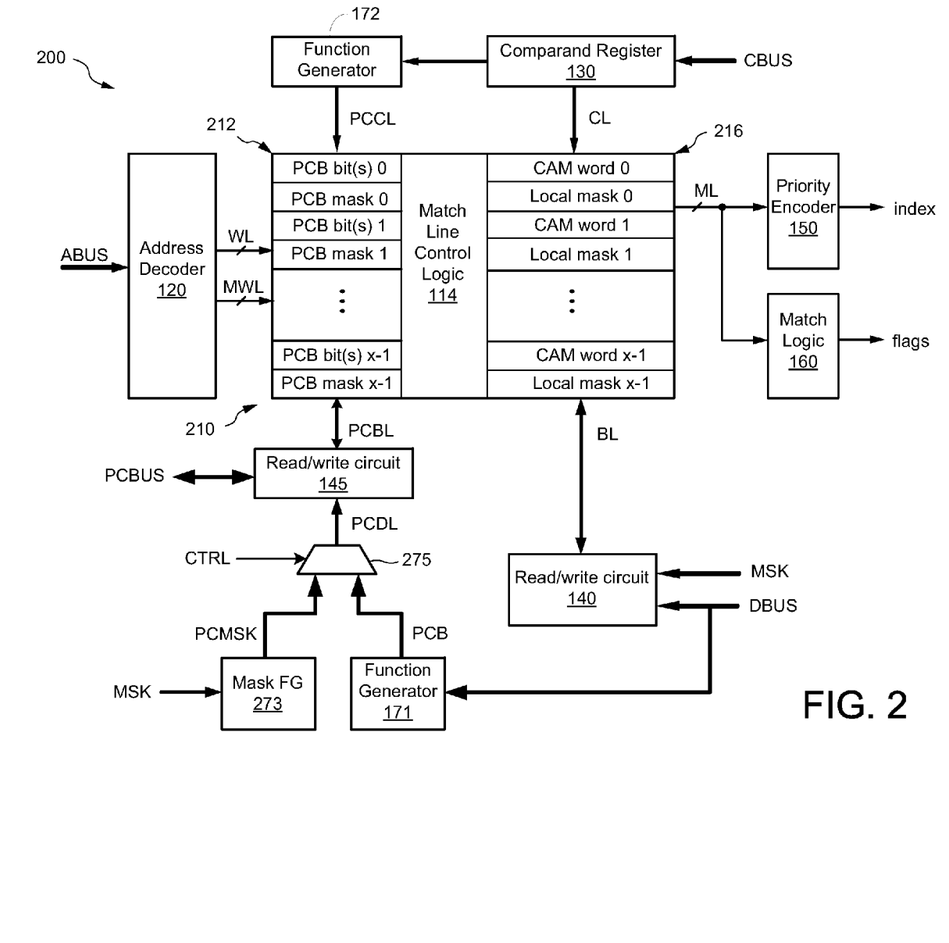
FIG. 2 is a block diagram of a ternary CAM device that incorporates the pre-compare CAM array technique of FIG. 1.

As compared to binary CAM arrays, when a CAM array stores ternary data values, the pre-compare technique of FIG. 1 uses additional circuits to handle individual mask words associated with ternary CAM arrays. Shown in FIG. 2 is a ternary CAM device 200 that implements this pre-compare technique. Within the ternary CAM device 200, instead of storing a binary CAM word, each row in main ternary CAM array 216 stores a CAM word and an associated main local mask word that stores masking data for the corresponding CAM word. The read/write circuit 140 includes an additional input to receive a main local mask word MSK. CAM device 200 further includes a mask function generator 273 and a multiplexer (MUX) 275. Mask function generator 273 generates pre-compare local mask word PCMSK by performing a selected logical function on the main local mask word MSK, and provides PCMSK to a first input of MUX 275, which also includes a second input to receive the pre-compare bits (PCB) from first function generator 171, a control terminal to receive a control signal CTRL, and an output coupled to read/write circuit 145. Through toggling the control signal CTRL, MUX 275 provides PCB and a corresponding PCMSK to read/write circuit 145, which in turn stores PCB and corresponding PCMSK into pre-compare CAM array 212 for pre-compare operations. Each row in pre-compare CAM array 212 stores a number of pre-compare bits (PCB bits) and an associated pre-compare local mask word (PCB mask) that masks the corresponding pre-compare bits on a bit-by-bit basis. In this manner, pre-compare CAM array 212 of FIG. 2 may reduce power consumption in a similar fashion to pre-compare CAM array 112 of FIG. 1.

However, the additional circuits mentioned above invariably increase power consumption of CAM device 200 and increase latency of CAM device 200. Nevertheless, to further include a block mask feature for the comparand (e.g., from a block mask register, not shown in FIG. 2 for simplicity), CAM device 200 should include the same additional circuits for second function generator 172, thereby further increasing power consumption and latency.

Perhaps more importantly, this pre-compare array technique is less effective in ternary CAM devices than in binary CAM devices. More specifically, if any of the bits in MSK are asserted, then mask function generator 273 asserts one or more corresponding bits in PCMSK. As a result, not only are bits in the CAM word masked by corresponding asserted bits in the associated local mask, but an extra portion of the CAM word is masked. This is to prevent the situation where bits which are masked in the main CAM array 216 cause the corresponding pre-compare entry to mismatch thereby preventing main CAM array entry from pre-charging its match line and participating in the compare operation. However, in the course of doing so, the corresponding pre-compare CAM array 212 can generate a match even when a match is impossible. The percentage of mismatch conditions in pre-compare operations is thereby decreased, which in turns cuts the benefit of reductions in power consumption by performing pre-compare operations.

For example, if each row of main ternary CAM array 216 includes four segments of CAM cells for storing respective 4-bit portions D0[0:3], D1[0:3], D2[0:3], and D3[0:3] of a CAM word, then main local mask word MSK includes four segments, each for storing respective 4-bit portions MSK0[0:3], MSK1[0:3], MSK2[0:3], and MSK3[0:3]. For this example, mask function generator 273 may generate four corresponding pre-compare mask bits PCMSK[0:3], where PCMSK[0]=$f_m${MSK0[0:3]}, PCMSK[1]=$f_m${MSK1[0:3]}, PCMSK[2]=$f_m${MSK2[0:3]}, and PCMSK[3]=$f_m${MSK3[0:3]}, where $f_m$ is, for example, a bit-wise logical OR function performed by mask function generator 273. Then, if there are one or more mask bits asserted in each of MSK0[0:3], MSK1[0:3], MSK2[0:3], and MSK3[0:3], respectively, the mask function generator 273 asserts all four bits of PCMSK[0:3], which in turn forces the pre-compare array 212 to indicate a match for all four segments. In this example, the usefulness of having a pre-compare array 212 is severely diminished because the pre-compare array 212 enables a corresponding row in the main CAM array 216 for compare operations even when there is no possibility of a match condition therein.

Under the same principle, if a CAM word has a corresponding local mask word with many scattered asserted mask bits, then mask function generator 273 asserts a significant number of mask bits in a corresponding pre-compare local mask word, thereby increasing the probability of unnecessary pre-charging a corresponding main match line. This decreases the effectiveness of the pre-compare array technique of FIG. 2. Therefore, it is desirable to have a pre-compare circuit that accommodates a data word and its corresponding local mask word without diminishing the effectiveness of the pre-compare operation.

The present embodiments reduce the power consumption of CAM devices during compare operations between a search key and ternary words stored in a CAM array by selectively enabling the match lines in the CAM array in response to pre-compare operations between a set of population counts corresponding to the search key and sets of population counts corresponding to the ternary words stored in the CAM array. For some embodiments, a binary search key is combined with a block mask to form a ternary or masked search key (e.g., where the block mask serves to mask the binary search key to form the masked search key). According to present embodiments, the population counts are generated using a population counter. For some embodiments, the set of population counts corresponding to the masked search key is generated by determining a first value indicating how many bits of the masked search key have the same predetermined logic value, and determining a second value indicating how many bits of the masked search key have the same predetermined logic value plus how many bits of the masked search key are don't care values. For some embodiments, each of the sets of population counts corresponding to the ternary words is generated by determining a third value indicating how many bits of the ternary word have the same predetermined logic value, and a fourth value indicating how many bits of the ternary word have the same predetermined logic value plus how many bits of the ternary word are don't care values. In accordance with present embodiments, a pre-compare circuit compares the first and fourth values and compares the second and third values to determine whether a match in the CAM array is possible, and in response thereto selectively pre-charges the match lines of corresponding rows of the CAM array. For certain embodiments, the population counter for the masked search key and the population counter for the ternary word share the same circuit.

For simplicity, generation of the population counts is described herein as being performed on the whole ternary word to generate a set of population counts for each row. However, for other embodiments, each row can include a plurality of segments, and population counts can be generated for each segment of a ternary word to generate corresponding sets of population counts.

Figure 3A:
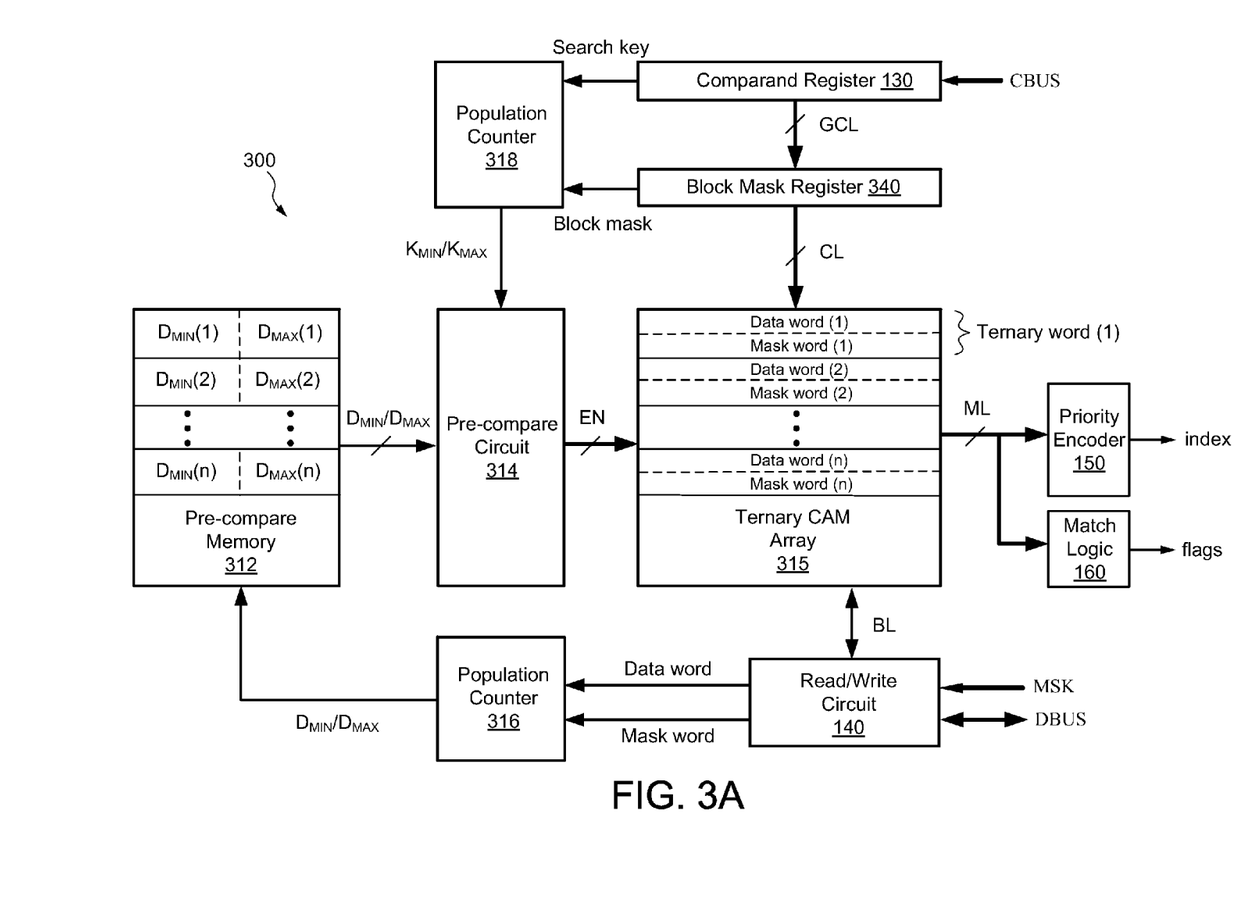
FIG. 3A is a block diagram of a CAM device in accordance with present embodiments.

FIG. 3A shows a block diagram of a CAM device 300 in accordance with the present embodiments. CAM device 300 is shown to include a ternary CAM array 315, a comparand register 130, a block mask register 340, and read/write circuit 140. CAM device 300 further includes a pre-compare memory 312, a pre-compare circuit 314, a first population counter 316, and a second population counter 318. One or more instructions and related control signals can be provided to CAM device 300 from an instruction decoder (not shown for simplicity) to control read, write, compare, initialization, and other operations for CAM device 300. Other well-known signals that can be provided to CAM device 300, such as enable signals, clock signals, and power connections, are not shown for simplicity.

Ternary CAM array 315 includes a plurality of rows, each including any number of CAM cells (not shown in FIG. 3A for simplicity) for storing a corresponding ternary word. Although depicted in FIG. 3A and described below as ternary, the CAM cells can be any suitable type of CAM cell including, for example, binary CAM cells, ternary CAM cells, and/or quaternary CAM cells. Each row of CAM cells in ternary CAM array 315 is coupled to an address decoder via a corresponding word line WL (not shown for simplicity), and is also coupled to priority encoder 150 and match logic 160 via a corresponding match line ML. For simplicity, the match lines ML are represented collectively in FIG. 3A. In addition, for some embodiments, CAM device 300 includes a well-known match latch circuit (not shown for simplicity) coupled between the match lines ML and priority encoder to latch match results generated in ternary CAM array 315.

As shown in FIG. 3A, each row in ternary CAM array 315 stores a data word and an associated mask word that collectively represent a ternary CAM word. Thus, each mask word masks a corresponding data word on a bit-by-bit basis. For example, mask word (1) stores masking data for data word (1), mask word (2) stores masking data for data word (2), and so on. Similarly, comparand register 130 stores a search key for ternary CAM array 315, and block mask register 340 stores a block mask that stores masking data for selectively masking the search key on a bit-by-bit basis. Together, the search key and the block mask represent the masked search key, as depicted in FIG. 4.

First population counter 316 is coupled to read/write circuit 140 to receive a data word and a mask word, which collectively represent a corresponding ternary word to be stored in a row of the ternary CAM array 315. In operation, first population counter 316 performs a population count calculation on the corresponding ternary word to generate a minimum data population count ($D_{MIN}$) and a maximum data population count ($D_{MAX}$), where $D_{MIN}$ indicates how many bits of the corresponding ternary word have the same predetermined logic value, and $D_{MAX}$ indicates how many bits of the corresponding ternary word have the same predetermined logic value plus the number of asserted mask bits within the corresponding ternary word. Thus, for some embodiments, $D_{MIN}$ indicates how many bits of the ternary word have a logic "1" value, and $D_{MAX}$ indicates how many bits of the ternary word have a logic "1" value plus how many bits of the ternary word are don't care values. In this example, a logic "1" value for a mask bit indicates that the mask bit is asserted and thus will mask the corresponding bit of the data word.

Figure 4:
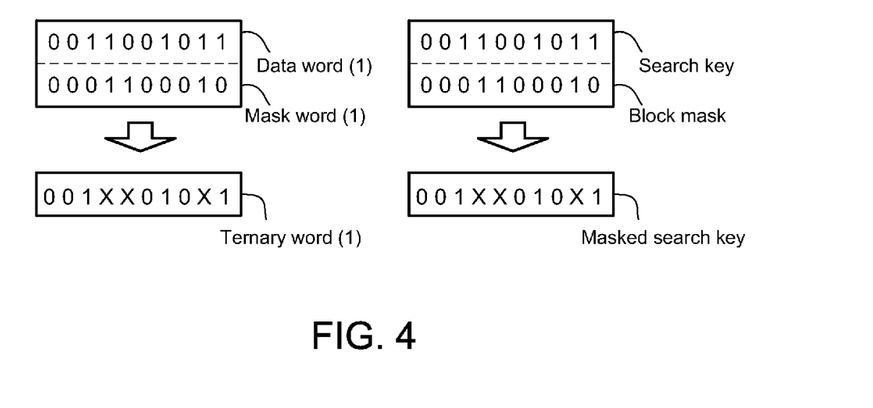
FIG. 4 is a block diagram illustrating how binary data and masks can be collectively represented in ternary forms.

For example, FIG. 4 shows a 10-bit binary data word {0011001011} and an associated 10-bit binary mask word {0001100010} that collectively represent a 10-bit ternary word {001XX010X1}, where X represents a "don't care" value, as depicted in FIG. 4. Therefore, for this example, since there are three "1's" in the ternary word, $D_{MIN}=3$. Similarly, since there are three "1's" and three "X's" in the ternary word, $D_{MAX}=6$.

Of course, for other embodiments, $D_{MIN}$ can indicate the number of bits within the corresponding ternary word having a logic "0" value, and $D_{MAX}$ can indicate the number of bits of the corresponding ternary word having a logic "0" value, plus the number of asserted mask bits (i.e., the number of bits in the ternary word having a don't-care value) in the corresponding ternary word. For such embodiments, $D_{MIN}=4$ and $D_{MAX}=7$ for the ternary word of FIG. 4.

Pre-compare memory 312 includes an input to receive sets of minimum data population counts $D_{MIN}$ and maximum data population counts $D_{MAX}$ from first population counter 316. More specifically, pre-compare memory 312 includes a plurality of rows, each for storing a set of $D_{MIN}$ and $D_{MAX}$ values for a corresponding ternary word stored in an associated row of ternary CAM array 315. For example, $D_{MIN}(1)$ and $D_{MAX}(1)$ are minimum and maximum population counts for ternary word (1), $D_{MIN}(2)$ and $D_{MAX}(2)$ are minimum and maximum population counts for ternary word (2), and so on. Pre-compare memory 312 also includes a plurality of outputs to provide sets of $D_{MIN}$ and $D_{MAX}$ values to pre-compare circuit 314 for pre-compare operations.

In some embodiments, in contrast to pre-compare CAM array 112 of FIG. 1, pre-compare memory 312 does not include CAM cells, but rather is formed using any suitable type of storage cell including, for example, an SRAM cell, a DRAM cell, an EEPROM cell, a flash memory cell, a latch, or a register.

Second population counter 318 is architecturally and functionally similar to first population counter 316. Second population counter 318 is coupled to comparand register 130 to receive a search key, and to block mask register 340 to receive a block mask. Together, the search key and the block mask collectively represent a masked search key, which is provided to ternary CAM array 315 for compare operations. For purposes of discussion herein, an asserted (e.g., logic high) mask bit masks a corresponding bit comparison between the masked search key and the corresponding ternary word, and a de-asserted mask bit (e.g., logic low) allows the corresponding bit comparison between the masked search key and the corresponding ternary word.

In operation, second population counter 318 performs a population count calculation on the masked search key to generate a minimum key population count ($K_{MIN}$) and a maximum key population count ($K_{MAX}$), where $K_{MIN}$ indicates how many bits of the masked search key have the same predetermined logic value, and $K_{MAX}$ indicates how many bits of the masked search key have the same predetermined logic value plus the number of asserted mask bits (i.e., the number of bits having a don't-care value) in the masked search key. Thus, for some embodiments, $K_{MIN}$ indicates how many bits of the masked search key have a logic "1" value, and $K_{MAX}$ indicates how many bits of the masked search key have a logic "1" value plus how many bits of the masked search key are don't care values. Put differently, in this example $K_{MAX}$ indicates how many bits of the unmasked search key have a logic "1" value plus how many bits of the block mask both are asserted and correspond to bits of the unmasked search key having a logic "0" value.

For example, FIG. 4 shows a 10-bit binary search key {0011001011} and a 10-bit block mask {0001100010} that collectively represent a 10-bit masked search key {001XX010X1}, where X represents a "don't care" value. Therefore, for this example, since there are three "1's" in the masked search key, $K_{MIN}=3$. Similarly, since there are three "1"s and three "X"s in the masked search key, $K_{MAX}=6$.

Of course, for other embodiments, $K_{MIN}$ can indicate the number of bits within the corresponding masked search key having a logic "0" value, and $K_{MAX}$ can indicate the number of bits of the corresponding masked search key having a logic "0" value, plus the number of asserted mask bits within the corresponding masked search key. (In other words, $K_{MAX}$ can indicate the number of bits of the masked search key having a logic "0" value plus the number of bits of the masked search key having a don't-care value.) In such embodiments, $K_{MIN}=4$ and $K_{MAX}=7$ for the masked search key of FIG. 4. It is noted, however, that second population counter 318 should employ the same methodology as first population counter 316 when performing population count calculations including, for example, the selection of the logic value to be counted in the population count calculation, and the determination of whether the search key is to be segmented. In some embodiments, the first population counter and the second population counter share the same circuit.

Pre-compare circuit 314 includes first inputs to receive sets of minimum/maximum data population counts $D_{MIN}/D_{MAX}$ from pre-compare memory 312, includes a second input to receive a set of minimum/maximum key population counts $K_{MIN}/K_{MAX}$ from second population counter 318, and includes a plurality of outputs coupled to corresponding rows of the TCAM array 315. As described in more detail below, pre-compare circuit 314 is configured to selectively enable rows in TCAM array 315 in response to pre-compare operations between $D_{MIN}$ and $K_{MAX}$, and between $D_{MAX}$ and $K_{MIN}$. More specifically, for each row in TCAM array 315, pre-compare circuit 314 asserts a corresponding enable signal EN to allow the row's match line to be pre-charged for a compare operation only if the corresponding set of $D_{MIN}$ and $D_{MAX}$ values provided by an associated row of pre-compare memory 312 results in $K_{MAX} \geq D_{MIN}$ and $D_{MAX} \geq K_{MIN}$. Otherwise, if $K_{MAX} < D_{MIN}$ or $D_{MAX} < K_{MIN}$ for a given ternary word, then pre-compare circuit 314 does not assert the corresponding enable signal EN, which in turn prevents the match line of the corresponding TCAM row from being pre-charged, thereby preventing the given ternary word from participating in the compare operation with the search key.

As explained in more detail below with respect to FIG. 6, the pre-compare results of $K_{MAX} \geq D_{MIN}$ and $D_{MAX} \geq K_{MIN}$ indicates that there is a possibility of a match between the search key and an associated ternary word stored in the TCAM array 315, and therefore the enable signal is asserted for the corresponding row in TCAM array 315 to enable the ternary word stored therein to participate in the compare operation. Conversely, the pre-compare results of $K_{MAX} < D_{MIN}$ or $D_{MAX} < K_{MIN}$ indicates that there is no possibility of a match between the search key and an associated ternary word stored in the TCAM array 315, and therefore the enable signal is de-asserted for the corresponding row in TCAM array 315 to prevent the ternary word stored therein from participating in the compare operation.

By selectively pre-charging each match line only when a match between an associated ternary word and the search key is possible in TCAM array 315, power consumption associated with pre-charging and discharging the match lines during successive compare operations is reduced. For example, for each match line in TCAM array 315 that is disabled (e.g., not pre-charged) in response to mismatch conditions in pre-compare circuit 314, power consumption associated with pre-charging the corresponding match line in TCAM array 315 is reduced. The reduction in power consumption associated with pre-charging the match lines in TCAM array 315 can be increased by increasing the percentage of mismatch conditions in the pre-compare operations.

Figure 3B:
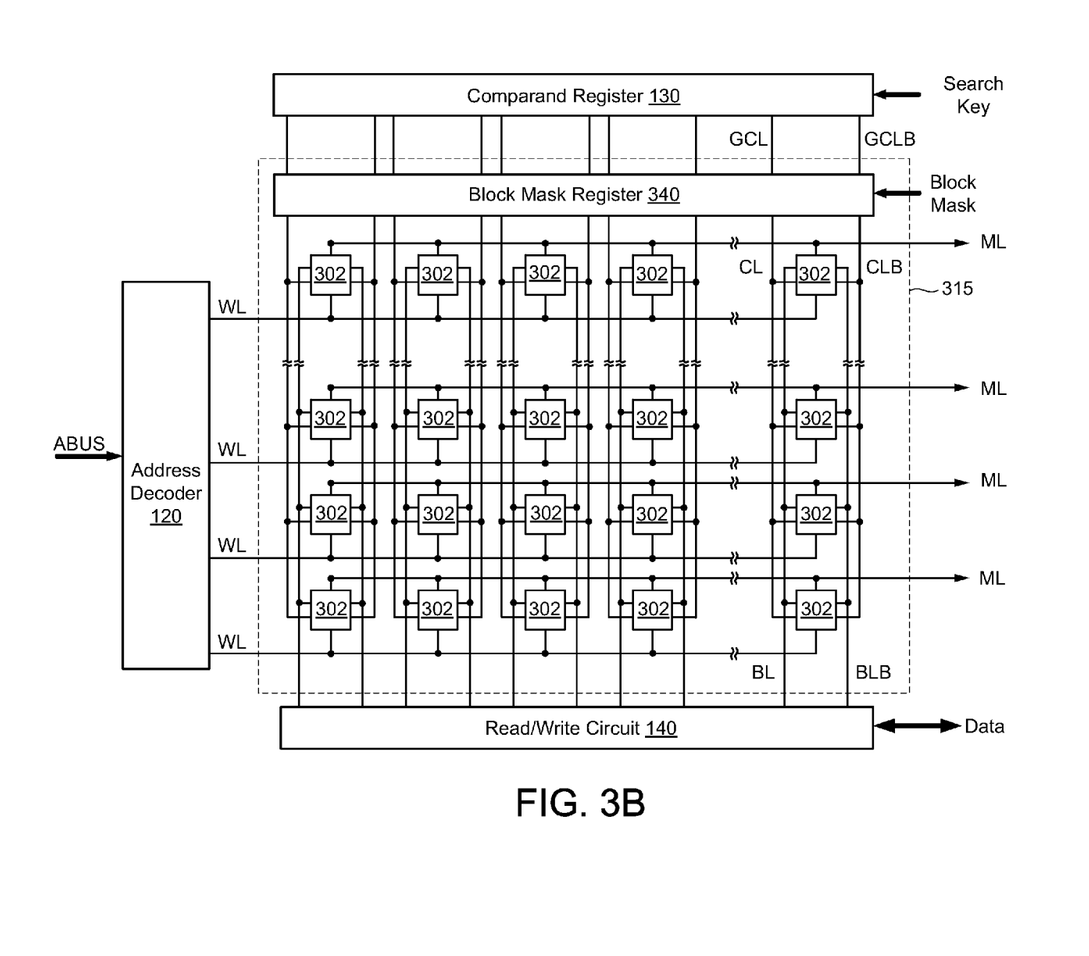
FIG. 3B is a block diagram of one embodiment of the CAM array of FIG. 3A.

FIG. 3B shows one embodiment of CAM array 315 of FIG. 3A. Array 315 includes a plurality of CAM cells 302 organized in any number of rows and columns. CAM cells 302 may be any suitable well-known SRAM-based, DRAM-based, non-volatile, or other ternary (or quaternary) CAM cell. Each row of CAM array 315 may also include one or more validity bits. Each row of CAM cells 302 is coupled to a match line ML and to a word line WL. Each word line WL is driven by address decoder 120 to select one or more rows of CAM cells 302 for writing or reading. Each match line ML provides the match results of a compare operation between the search key and a CAM word to priority encoder 150 and to match logic 160. Each column of CAM cells 302 in CAM array 315 is coupled to a complementary bit line pair BL and BLB and to a complementary comparand line pair CL and CLB. The bit line pairs BL/BLB are each coupled to read/write circuit 140, and the comparand line pairs CL/CLB are each coupled to block mask register 340, which in turn is coupled to comparand register 130 via global comparand line pairs GCL/GCLB.

During compare operations, a match line ML indicates a match condition for the row only if all CAM cells 302 in that row match the search key. As described above, for some embodiments, the match lines ML are selectively pre-charged for compare operations with the search key in response to match results in pre-compare circuit 314. If any CAM cell 302 in the row does not match the search key, the CAM cell(s) 302 discharges the match line ML toward ground potential (i.e., logic low) to indicate the mismatch condition. Conversely, if all CAM cells 302 match the search key, the match line ML remains in a charged (i.e., logic high) state to indicate the match condition.

Figure 5:
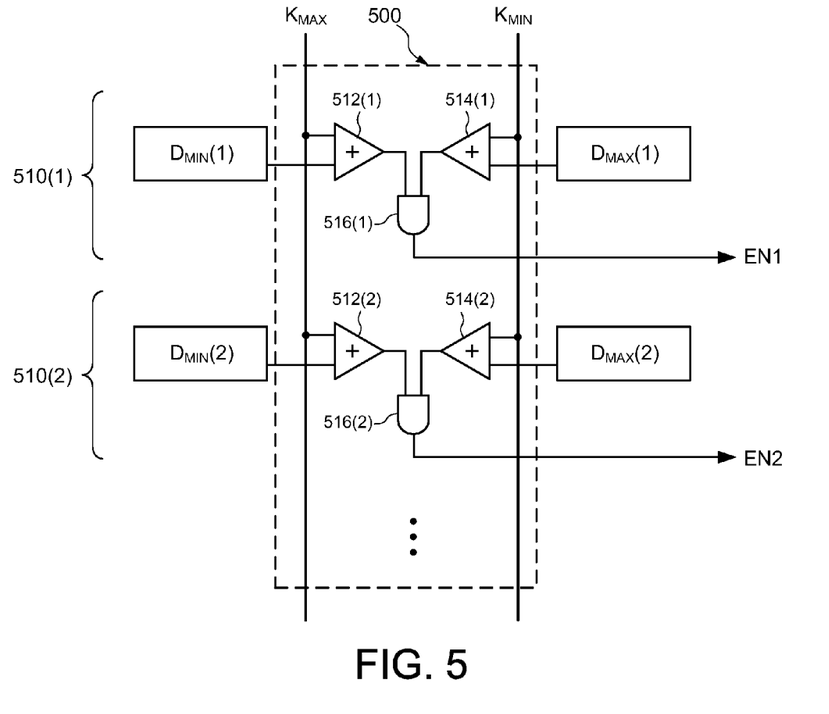
FIG. 5 is a block diagram of an embodiment of the pre-compare circuit of FIG. 3.

FIG. 5 is a pre-compare circuit 500 that is one embodiment of pre-compare circuit 314 of FIG. 3A. Pre-compare circuit 500 includes a plurality of segments 510, each having a first comparator 512, a second comparator 514, and an AND gate 516. Each segment 510 is coupled to a corresponding row of pre-compare memory 312 to receive a set of $D_{MIN}/D_{MAX}$ values for an associated ternary word stored in the TCAM array 315 (not shown in FIG. 5 for simplicity), and is coupled to second population counter 318 (not shown in FIG. 5 for simplicity) to receive the set of $K_{MIN}/K_{MAX}$ for the masked search key. For example, segment 510(1) receives $D_{MIN}(1)/D_{MAX}(1)$ associated with ternary word (1), segment 510(2) receives $D_{MIN}(2)/D_{MAX}(2)$ associated with ternary word (2), and so on. In operation, each segment 510 generates an enable signal EN that selectively pre-charges the match line of a corresponding row in ternary CAM array 315 in response to comparison results from first comparator 512 and second comparator 514. More specifically, the first comparator 512 receives $D_{MIN}$ and $K_{MAX}$ and generates a first Boolean result as true if $K_{MAX} \geq D_{MIN}$. Similarly, the second comparator 514 receives $D_{MAX}$ and $K_{MIN}$ and generates a second Boolean result as true if $D_{MAX} \geq K_{MIN}$. The AND gate 516 receives the results from first comparator 512 and second comparator 514, and asserts the enable signal EN (e.g., to logic high) if the results from first comparator 512 and second comparator 514 are both true (i.e., if $K_{MAX} \geq D_{MIN}$ and $D_{MAX} \geq K_{MIN}$). The logic high state of EN pre-charges the match line of a corresponding row in TCAM array 315, thereby enabling the row to participate in the compare operation with the search key. Otherwise, if either $K_{MAX} < D_{MIN}$ or $D_{MAX} < K_{MIN}$, logic gate 516 de-asserts the enable signal EN (e.g., to logic low), thereby not pre-charging the corresponding match line and preventing the associated row of TCAM array 315 from participating in the compare operation with the search key.

Figure 6:
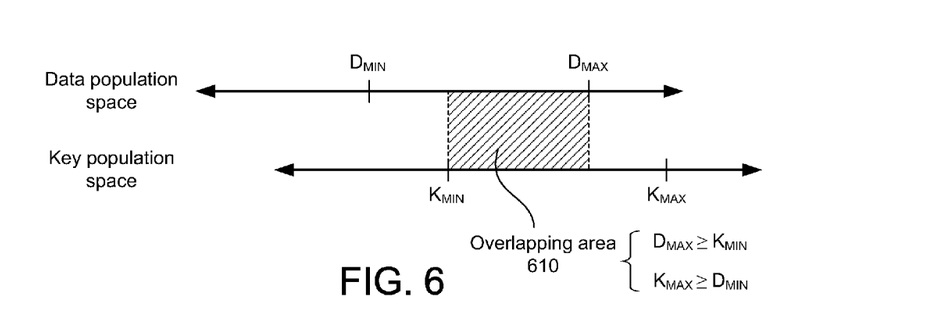
FIG. 6 is an illustration of how a comparison between data and key population counts may prevent unnecessary pre-charging according to some embodiments.

As illustrated in FIG. 6, the calculation of minimum and maximum data population counts $D_{MIN}/D_{MAX}$ depicts the data population space, which is bounded by the minimum and maximum number of bits in a corresponding ternary word which could have the same predetermined logic value (e.g., but for the asserted mask bits in the corresponding mask word). Under the same principle, the calculation of minimum and maximum key population counts $K_{MIN}/K_{MAX}$ depicts the search key population space, which is bounded by the minimum and maximum number of bits in the masked search key which could have the same predetermined logic value (e.g., but for the asserted mask bits in the block mask). Therefore, if the comparison operations among the four population counts indicate that $D_{MAX} \geq K_{MIN}$ and $K_{MAX} \geq D_{MIN}$, then there is an overlapping area 610 between the data population space and the key population space, meaning a possibility exists that the corresponding ternary word can match the (masked) search key.

Conversely, if $D_{MAX} < K_{MIN}$, then the maximum number of bits which could match a "1" in the corresponding ternary word is still smaller than the minimum number of "1's" in the masked search key, and therefore a match between the corresponding ternary word and the masked search key in TCAM array 315 is impossible. Similarly, if $K_{MAX} < D_{MIN}$, then the maximum number of bits which could match a "1" in the masked search key is still smaller than the minimum number of "1's" in the corresponding ternary word, and therefore a match between the corresponding ternary word and the masked search key is impossible. As a result, if either $D_{MAX} < K_{MIN}$ or $K_{MAX} < D_{MIN}$, meaning there is no overlapping area 610 and a match in TCAM array 315 is impossible, pre-compare circuit 314 de-asserts the associated EN signal, and thus does not pre-charge the match line of the corresponding row in ternary CAM array 315, thereby saving the power consumption associated with alternatively pre-charging and discharging the corresponding match line unnecessarily.

Referring again to FIG. 5, for other embodiments, each segment 510 of pre-compare circuit 500 can include a single comparator (e.g., comparator 512) that compares $D_{MIN}$ with $K_{MAX}$ and then compares $D_{MAX}$ with $K_{MIN}$ in a pipelined manner, whereby the results of the earlier compare operation (e.g., $D_{MIN}$ with $K_{MAX}$) are stored in a suitable memory element (not shown for simplicity) and then combined with the results of the latter compare operation (e.g., $D_{MAX}$ with $K_{MIN}$) to generate the corresponding enable signal EN. Thus, if the two pipelined compare operations result in asserted logic high signals to indicate that $K_{MAX} \geq D_{MIN}$ and $D_{MAX} \geq K_{MIN}$, then the corresponding enable signal EN is asserted to enable the corresponding row of TCAM array 315 to participate in the compare operation. Otherwise, the corresponding enable signal EN is de-asserted to prevent the corresponding row of TCAM array 315 from participating in the compare operation.

Figure 7:
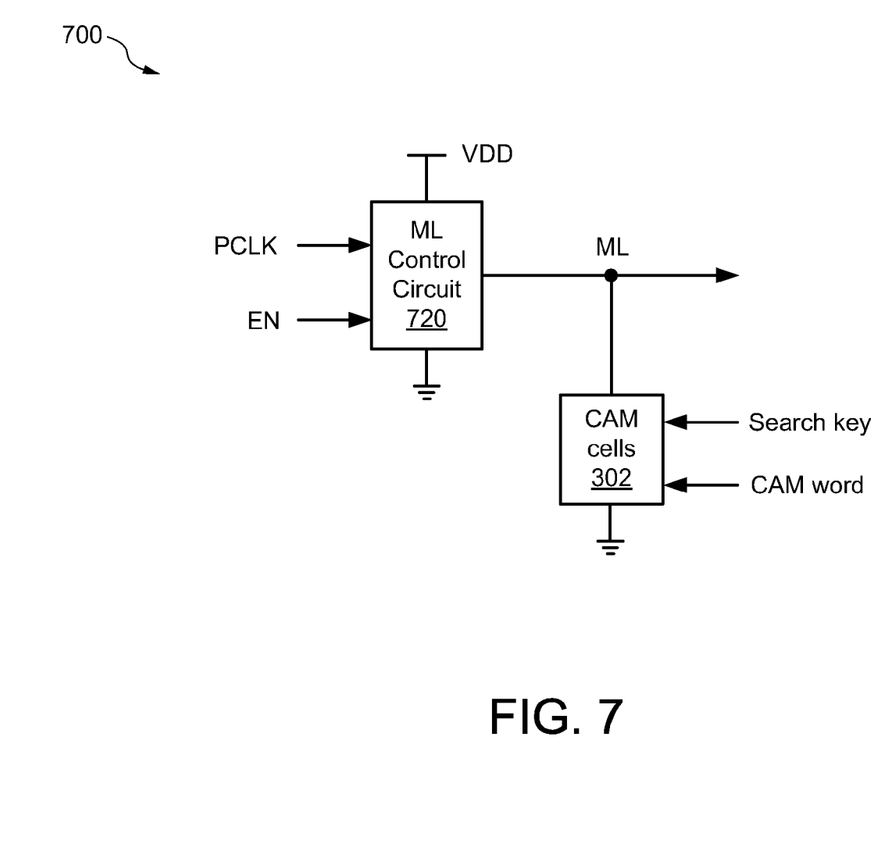
FIG. 7 is a block diagram of one embodiment of a row of the CAM array of FIGS. 3A-3B.

FIG. 7 is a block diagram of a row 700 that is one embodiment of the rows in TCAM array 315 of FIGS. 3A-3B. Row 700 is shown to include a match line control circuit 720 and a plurality of CAM cells 302. For simplicity, the plurality of CAM cells 302 are represented collectively in FIG. 7. Match line control circuit 720 has power terminals connected to VDD and to ground potential, and includes a first input to receive the enable signal EN from a corresponding segment 510 of pre-compare circuit 500 of FIG. 5, a second input to receive a pre-charge signal PCLK, and an output coupled to the match line ML. CAM cells 302, which are connected between match line ML and ground potential, include data inputs to receive the CAM words and include compare inputs to receive the search key.

During a pre-charge phase of a compare operation, the pre-charge clock signal PCLK is asserted (e.g., to logic high), and the enable signal EN is selectively asserted by the pre-compare circuit 314. More specifically, if the enable signal EN is asserted (e.g., to logic high) in response to $D_{MAX} \geq K_{MIN}$ and $K_{MAX} \geq D_{MIN}$ (which indicates there is a possibility that the search key can match the ternary word stored in the row 700), then the match line control circuit 720 pre-charges the match line high towards VDD, thereby enabling the row 700 for the compare operation. Then, during the evaluation phase, if the search key matches the ternary word stored in row 700, the match line ML remains in its logic high state to indicate the match condition. Conversely, if the search key does not match the ternary word stored in row 700, the mismatching CAM cell(s) 302 discharge the match line ML low towards ground potential to indicate the mismatch condition.

However, if the enable signal EN is de-asserted (e.g., to logic low) in response to either $D_{MAX} < K_{MIN}$ or $K_{MAX} < D_{MIN}$ (which indicates there is no possibility that the search key can match the ternary word stored in the row 700), then the match line control circuit 720 does not pre-charge the match line, thereby disabling the row 700 for the compare operation and reducing power consumption associated with charging and discharging the match line during compare operations.

Match line control circuit 720 can be any well-known circuit that selectively charges the match line ML for compare operations in response to the enable signal EN. For example, various match line control circuits disclosed in commonly-owned U.S. Pat. No. 7,050,318, which is incorporated by reference herein in its entirety, can be used for match line control circuit 720 of FIG. 7.

Figure 8:
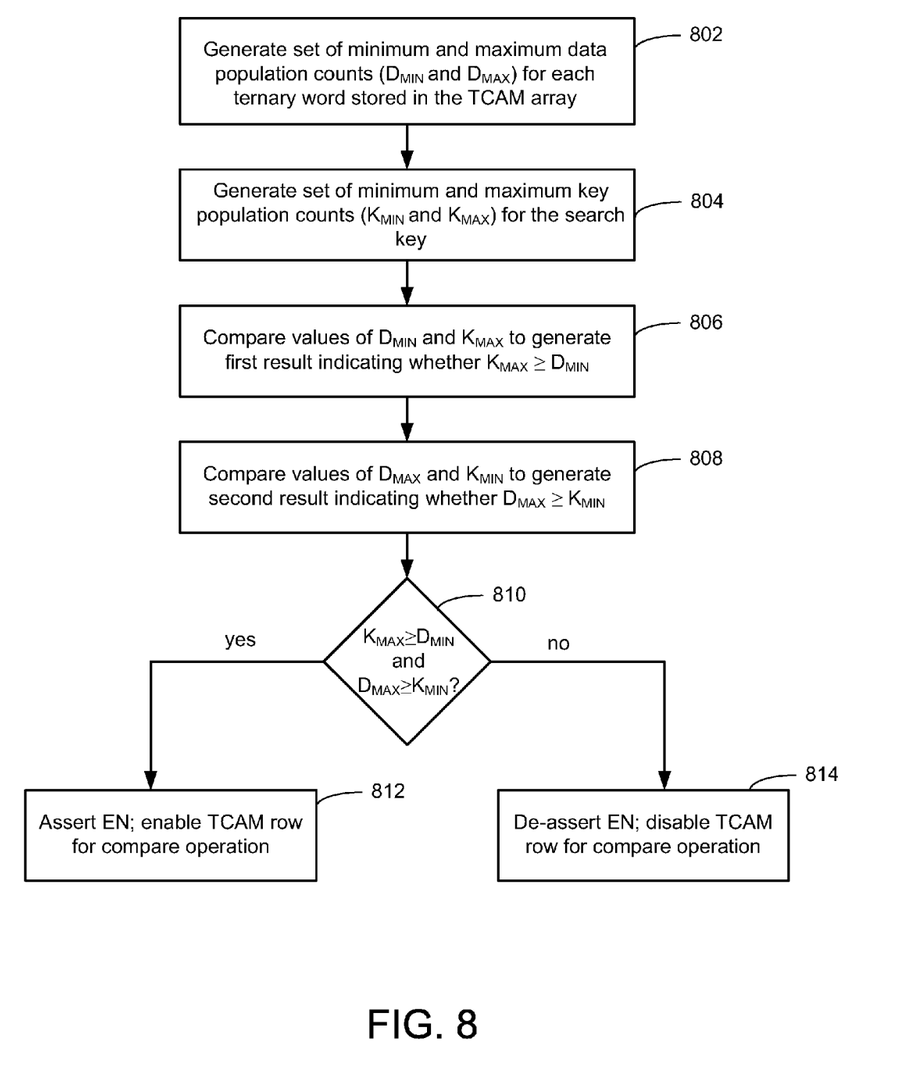
FIG. 8 is a flow chart illustrating an exemplary pre-compare operation for embodiments of the CAM device of FIG. 3.

FIG. 8 is a flowchart illustrating an exemplary pre-compare operation for embodiments of the CAM device of FIGS. 3A-3B. First, the first population counter 316 generates a data set including a minimum data population count ($D_{MIN}$) and a maximum data population count ($D_{MAX}$) for each ternary word stored in the CAM array 315 (802). $D_{MIN}$ and $D_{MAX}$ are calculated as described above. Next, the second population counter 318 generates a set of population counts including a minimum key population count ($K_{MIN}$) and a maximum key population count ($K_{MAX}$) for the search key (804). $K_{MIN}$ and $K_{MAX}$ are calculated as described above.

Next, pre-compare circuit 314 compares the values of $D_{MIN}$ and $K_{MAX}$ to generate a first result indicating whether $K_{MAX} \geq D_{MIN}$ (806), and compares the values of $D_{MAX}$ and $K_{MIN}$ to generate a second result indicating whether $D_{MAX} \geq K_{MIN}$ (808). Then, if the first and second results indicate that $D_{MAX} \geq K_{MIN}$ and $K_{MAX} \geq D_{MIN}$ (which indicates there is a possibility that the search key can match the ternary word stored in the row 700), as tested at 810, then the match line control circuit 720 pre-charges the match line high towards VDD, thereby enabling the row 700 for the compare operation (812). Conversely, if the first and second results indicate that either $D_{MAX} < K_{MIN}$ or $K_{MAX} < D_{MIN}$ (which indicates there is no possibility that the search key can match the ternary word stored in the row 700), as tested at 810, then the match line control circuit 720 does not pre-charge the match line, thereby disabling the row 700 for the compare operation (814).

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile (and thus non-transitory) storage media in various forms (e.g., optical, magnetic or semiconductor storage media).

What is claimed is:

1. A content addressable memory (CAM) device for comparing a search key with a plurality of ternary words, comprising:
   an array having a plurality of rows of CAM cells and a respective row to store an associated ternary word, wherein each respective row is coupled to a corresponding match line, and wherein the associated ternary word embodies a binary data word masked by a local mask word; and
   a pre-compare memory having a plurality of rows of memory cells and a respective row to store a minimum data population count ($D_{MIN}$) and a maximum data population count ($D_{MAX}$) for a corresponding ternary word stored in the array, wherein $D_{MIN}$ indicates how many bits of the ternary word are of a same predetermined logic value, and $D_{MAX}$ indicates how many bits of the ternary word are of the same predetermined logic value plus how many bits of the ternary word have a don't-care value.

2. The CAM device of claim 1, further comprising:
   a first population counter to generate corresponding sets of $D_{MIN}$ and $D_{MAX}$.

3. The CAM device of claim 2, wherein the first population counter is configured to generate $D_{MIN}$ by counting how many logic ones are in the ternary word, and to generate $D_{MAX}$ by counting how many logic ones are in the ternary word plus how many logic ones are in the local mask word.

4. The CAM device of claim 2, wherein the first population counter is configured to generate $D_{MIN}$ by counting how many logic zeros are in the ternary word, and to generate $D_{MAX}$ by counting how many logic zeros are in the ternary word plus how many logic ones are in the local mask word.

5. The CAM device of claim 2, further comprising:
   a block mask register coupled to the array and configured to store a block mask; and
   a second population counter to generate a minimum key population count ($K_{MIN}$) and a maximum key population count ($K_{MAX}$) for a masked search key formed by the search key and the block mask.

6. The CAM device of claim 5, wherein the first population counter and the second population counter share the same circuit.

7. The CAM device of claim 5, wherein $K_{MIN}$ indicates how many bits of the masked search key are of the same predetermined logic value, and $K_{MAX}$ indicates how many bits of the masked search key are of the same predetermined logic value plus how many bits of the masked search key have a don't-care value.

8. The CAM device of claim 7, wherein the second population counter is configured to generate $K_{MIN}$ by counting how many logic ones are in the masked search key, and to generate $K_{MAX}$ by counting how many logic ones are in the masked search key plus how many logic ones are in the block mask.

9. The CAM device of claim 7, wherein the second population counter is configured to generate $K_{MIN}$ by counting how many logic zeros are in the masked search key, and to generate $K_{MAX}$ by counting how many logic zeros are in the masked search key plus how many logic ones are in the block mask.

10. The CAM device of claim 5, further comprising:
    a pre-compare circuit having a plurality of first inputs each for receiving a pair of $D_{MIN}$ and $D_{MAX}$ values from a corresponding row of the pre-compare memory, a second input to receive $K_{MIN}$ and $K_{MAX}$, and a plurality of outputs each coupled to a corresponding row of the array.

11. The CAM device of claim 10, wherein the pre-compare circuit is configured to selectively enable a respective row of the array for a compare operation with the search key in response to a comparison between $D_{MIN}$ and $K_{MAX}$ and a comparison between $D_{MAX}$ and $K_{MIN}$.

12. The CAM device of claim 11, wherein the pre-compare circuit is configured to assert an enable signal to enable the respective row if $K_{MAX} \geq D_{MIN}$ and $D_{MAX} \geq K_{MIN}$.

13. The CAM device of claim 12, further comprising match-line control circuitry to pre-charge the match line of the respective row in response to the asserted state of the enable signal.

14. The CAM device of claim 11, wherein the pre-compare circuit is configured to de-assert an enable signal to disable the respective row if either $K_{MAX} < D_{MIN}$ or $D_{MAX} < K_{MIN}$.

15. The CAM device of claim 10, where the pre-compare circuit includes a plurality of segments, each comprising:
    a first comparator having inputs to receive $K_{MAX}$ and $D_{MIN}$, and having an output;
    a second comparator having inputs to receive $D_{MAX}$ and $K_{MIN}$, and having an output; and
    a logic gate having inputs coupled to the outputs of the first and second comparators, and having an output to generate an enable signal that selectively pre-charges the match line of a corresponding row of the array.

16. A content addressable memory (CAM) device for comparing a search key with a plurality of ternary words, comprising:
    an array having a plurality of rows of CAM cells, a respective row to store an associated ternary word and being coupled to a corresponding match line, wherein the associated ternary word embodies a binary data word and a local mask word;
    a pre-compare memory having a plurality of rows of memory cells, a respective row to store a minimum data population count ($D_{MIN}$) and a maximum data population count ($D_{MAX}$) for a corresponding ternary word stored in the array; and
    a pre-compare circuit having a plurality of first inputs each for receiving a pair of $D_{MIN}$ and $D_{MAX}$ values from a corresponding row of the pre-compare memory, a second input to receive a minimum key population count ($K_{MIN}$) and a maximum key population count ($K_{MAX}$) associated with the search key, and a plurality of outputs each coupled to a corresponding row of the array.

17. The CAM device of claim 16, wherein $D_{MIN}$ indicates how many bits of the ternary word are of a same predetermined logic value, and $D_{MAX}$ indicates how many bits of the ternary word are of the same predetermined logic value plus how many bits of the ternary word have a don't-care value.

18. The CAM device of claim 17, further comprising:
a first population counter to generate corresponding sets of $D_{MIN}$ and $D_{MAX}$.

19. The CAM device of claim 18, wherein the first population counter is configured to generate $D_{MIN}$ by counting how many logic ones are in the ternary word, and to generate $D_{MAX}$ by counting how many logic ones are in the ternary word plus how many logic ones are in the local mask word.

20. The CAM device of claim 16, wherein $K_{MIN}$ indicates how many bits of a masked search key are of the same predetermined logic value, and $K_{MAX}$ indicates how many bits of the masked search key are of the same predetermined logic value plus how many bits of the masked search key have a don't-care value.

21. The CAM device of claim 18, further comprising:
a block mask register coupled to the array and configured to store a block mask; and
a second population counter to generate $K_{MIN}$ and $K_{MAX}$.

22. The CAM device of claim 21, wherein the second population counter is configured to generate $K_{MIN}$ by counting how many logic ones are in the masked search key, and to generate $K_{MAX}$ by counting how many logic ones are in the masked search key plus how many logic ones are in the block mask.

23. The CAM device of claim 16, wherein the pre-compare circuit is configured to selectively enable a respective row of the TCAM array for a compare operation with the search key in response to a comparison between $D_{MIN}$ and $K_{MAX}$ and a comparison between $D_{MAX}$ and $K_{MIN}$.

24. The CAM device of claim 23, wherein the pre-compare circuit is configured to assert an enable signal if $K_{MAX} \geq D_{MIN}$ and $D_{MAX} \geq K_{MIN}$.

25. The CAM device of claim 23, wherein the pre-compare circuit is configured to de-assert an enable signal if either $K_{MAX} < D_{MIN}$ or $D_{MAX} < K_{MIN}$.

26. A method of comparing a search key with a plurality of ternary words stored in corresponding rows of a content addressable memory (CAM) array, wherein each ternary word embodies a data word and a local mask word, the method comprising:
generating a data set including a minimum data population count ($D_{MIN}$) and a maximum data population count ($D_{MAX}$) for each ternary word;
generating a key set including a minimum key population count ($K_{MIN}$) and a maximum key population count ($K_{MAX}$) for the search key;
comparing values of $D_{MIN}$ and $K_{MAX}$ to generate a first result indicating whether $K_{MAX} \geq D_{MIN}$;
comparing values of $D_{MAX}$ and $K_{MIN}$ to generate a second result indicating whether $D_{MAX} \geq K_{MIN}$; and
selectively enabling rows of the CAM array in response to the first and second results.

27. The method of claim 26, wherein $D_{MIN}$ indicates how many bits of the ternary word are of a same predetermined logic value, and $D_{MAX}$ indicates how many bits of the ternary word are of the same predetermined logic value plus how many bits of the ternary word have a don't-care value.

28. The method of claim 27, wherein a first population counter generates $D_{MIN}$ by counting how many logic ones are in the ternary word, and generates $D_{MAX}$ by counting how many logic ones are in the ternary word plus how many logic ones are in the local mask word.

29. The method of claim 26, wherein $K_{MIN}$ indicates how many bits of a masked search key corresponding to the search key and an associated block mask are of the same predetermined logic value, and $K_{MAX}$ indicates how many bits of the masked search key are of the same predetermined logic value plus how many bits of the masked search key have a don't-care value.

30. The method of claim 29, wherein the second population counter generates $K_{MIN}$ by counting how many logic ones are in the masked search key, and generates $K_{MAX}$ by counting how many logic ones are in the masked search key plus how many logic ones are in the block mask.

31. The method of claim 26, wherein the selectively enabling comprises:
pre-charging a match line for a corresponding row only if $K_{MAX} \geq D_{MIN}$ and if $D_{MAX} \geq K_{MIN}$.

32. A content addressable memory (CAM) array having a plurality of rows of CAM cells, wherein each row stores a ternary word embodied by a data word and a local mask word, comprising:
means for generating a data set including a minimum data population count ($D_{MIN}$) and a maximum data population count ($D_{MAX}$) for each ternary word;
means for generating a key set including a minimum key population count ($K_{MIN}$) and a maximum key population count ($K_{MAX}$) for a search key;
means for comparing values of $D_{MIN}$ and $K_{MAX}$ to generate a first result indicating whether $K_{MAX} \geq D_{MIN}$;
means for comparing values of $D_{MAX}$ and $K_{MIN}$ to generate a second result indicating whether $D_{MAX} \geq K_{MIN}$; and
means for selectively enabling rows of the CAM array in response to the first and second results.

* * * * *